United States Patent [19]
Carobolante

[11] Patent Number: 5,550,497
[45] Date of Patent: Aug. 27, 1996

[54] POWER DRIVER CIRCUIT WITH REDUCED TURNOFF TIME

[75] Inventor: Francesco Carobolante, Portola Valley, Calif.

[73] Assignee: SGS-Thomson Microelectronics, Inc., Carollton, Tex.

[21] Appl. No.: 249,851

[22] Filed: May 26, 1994

[51] Int. Cl.⁶ .................... H03K 17/04; H03K 17/296
[52] U.S. Cl. .................... 327/110; 327/374; 327/377; 327/396; 327/442
[58] Field of Search .................... 327/316, 374, 327/377, 440, 442, 483, 502, 520, 580, 376, 387, 396, 401, 110

[56] References Cited

U.S. PATENT DOCUMENTS

| | | | |
|---|---|---|---|
| 3,978,350 | 8/1976 | Fletcher et al. | 327/483 |
| 4,042,836 | 8/1977 | Crompton et al. | 327/376 |
| 4,886,985 | 12/1989 | Flohrs et al. | 327/483 |
| 4,945,396 | 7/1990 | Shigekane et al. | 327/483 |

FOREIGN PATENT DOCUMENTS 3723581  7/1986  Germany.

Primary Examiner—Timothy P. Callahan
Assistant Examiner—Jung Ho Kim
Attorney, Agent, or Firm—Joseph Arrambide; Lisa K. Jorgenson; Richard K. Robinson

[57] ABSTRACT

This application discloses circuit and method for reducing the turn-off time of a power transistor driving an inductive load. The circuit clamps the gate to source of a power transistor by using two field effect transistors as the current path across the gate and source of the power transistor. A zener diode connected from the source to gate of the two field effect transistors is used to provide high voltage protection.

17 Claims, 2 Drawing Sheets

POWER DRIVER CIRCUIT WITH REDUCED TURNOFF TIME

BACKGROUND OF THE INVENTION

1. Field of the Invention

This invention relates to improvements in transistor circuits, and more particularly, to improvements in circuits for reducing the turnoff time of power transistors, and still more particularly to improvements in circuitry for reducing the turnoff time of field effect transistors used for driving inductive loads, stator windings in direct current motors, and the like.

2. Description of the Relevant Art

The problem addressed by this invention is encountered especially in integrated power drivers when used as current sources for inductive loads such as stator windings in direct current motors. Typically, the transistor types used for power driving are either bipolar NPN's or N-channel MOSFET's. When driving an inductive load, a recirculation or free wheeling diode may be provided to supply a path for the load current at turnoff.

Thus with reference to FIG. 1, one prior art circuit embodiment typically may include an n-channel MOSFET power transistor 10 that provides drive current to an inductive load 12 and non-inductive circuitry, indicated generally as box 14. Typically inductive load 12 is a stator winding in a dc motor such as those used in floppy, winchester and compact disk drives. A diode 16 is connected in parallel with inductive load 12 to provide a recirculation path for the current in the load 12 when transistor 10 is turned off. Thus, when the current to inductive load 12 is turned off, the inductive action of the coil 12 will tend to maintain the current flowing from the source connection through the load 12 to ground. This continued current is conducted by freewheeling diode 16.

To turn off power transistor 10, its gate is switched from a positive voltage Vp to ground by switch 21 as indicated by signal 18. Switch 21 represents the commutation control circuitry of a disk drive. Turning off the power transistor 10 may, in fact, be difficult, due to the fact that inductive load 12 pulls the source of power transistor 10 below ground. Because its source is pulled negative, even with its gate at ground potential, the power transistor 10 remains on despite the transistor 10's gate being driven low.

With reference now to prior art FIG. 2, a circuit similar to the prior art circuit of FIG. 1 is shown but has an additional transistor 20 and a switch 22. The drain of transistor 20 is connected to the gate of power transistor 10 and the source of transistor 20 is connected to the drain of power transistor 10. Transistor 20 has a parasitic or intrinsic diode 23 which effectively has a cathode connected to its drain and an anode connected to its source.

In operation, power transistor 10 is turned off by switching switch 21 from Vp to ground or an open circuit while simultaneously switching switch 22 from ground to Vp, as shown by signal 18 and 24 in FIG. 2. Switch 21 and 22 represent the commutation control circuitry of the disk drive. As power transistor 10 turns off, its source is pulled low due to the inductive action of the winding 12 which accelerates the depletion of charge from the gate of power transistor 10 through the conductive path of transistor 20. Transistor 20 in this circuit effectively shortens the turn-off time of power transistor 10 by facilitating the depletion of the charge from the gate of power transistor 10. Additionally, power transistor 10 is held off, even if the inductive voltage pulls the source below ground by effectively "clamping" the gate and source of power transistor 10 at about the same voltage.

If switch 21 is grounded instead of floating, then the charge is quickly depleted from the gate of power transistor 10 which further facilitates its turn-off. However, large currents are drawn from ground and through transistor 20 when the source of transistor 10 is pulled low by the recirculation of the inductor. Therefore, it is the designers choice whether to turn off the power transistor by switching its gate to ground or by clamping its gate to source or by both.

It has been observed that, in some applications, the $V_{gs}$ (gate to source voltage) across transistor 20 can be very high due to the fact that transistor 20 requires significant positive gate voltages, relative to the source, to turn on and since the source voltage can be driven to large negative voltages by the recirculation of inductive load 12. This potentially large $V_{gs}$ may cause reliability problems in transistor 20.

It has also been observed that the voltage at the source of transistor 20 is fed back to the gate of power transistor 10 through the parasitic diode 23 of transistor 20, even this feedback path through the parasitic diode 23 may have undesirable effects to the stability and response of the circuit.

SUMMARY OF THE INVENTION

In light of the above, therefore, it is an object of the invention to provide an improved technique and circuit for reducing the turn-off time of a power transistor.

It is still another object of the invention to decrease the $V_{gs}$ across the clamping circuit.

It is still another object of the invention to increase the reliability of the clamping circuit.

It is still another object of the invention to decrease the feedback through the clamping circuit.

DETAILED DESCRIPTION OF THE PREFERRED EMBODIMENT

Figure 1:
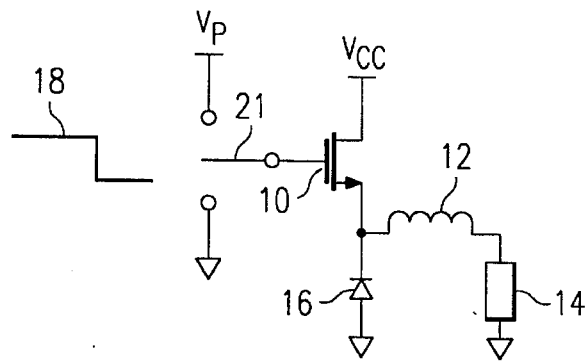
FIGS. 1 and 2 are electrical schematic diagrams of the transistor driver circuits for driving an inductive load, in accordance with the prior art.
Figure 2:
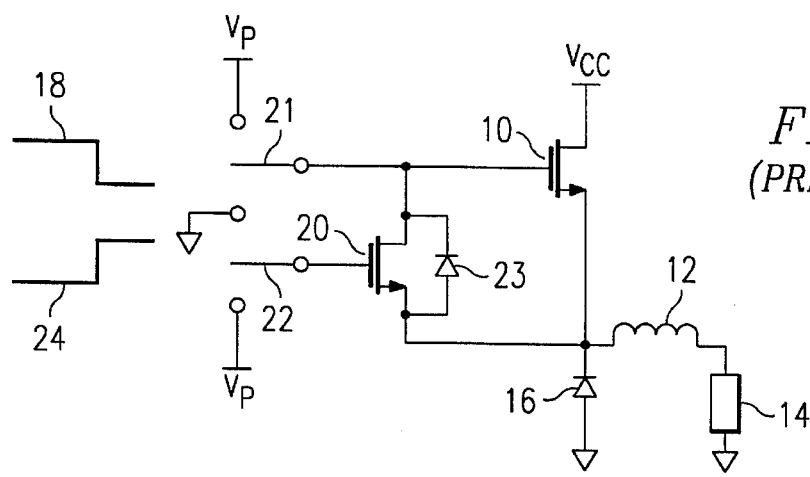
Figure 3:
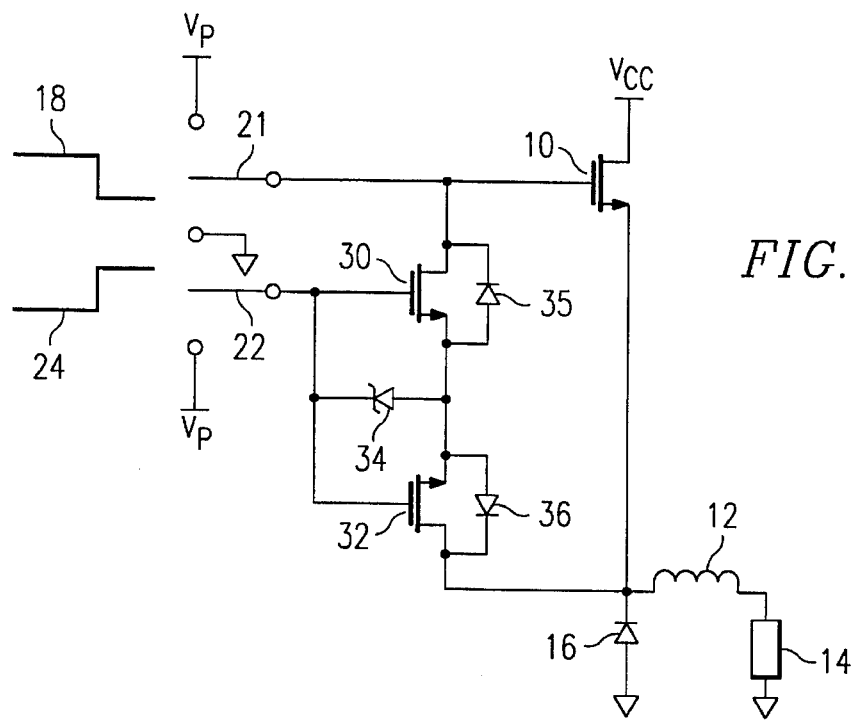
FIG. 3 is an electrical schematic diagram of a circuit in accordance with a first preferred embodiment of the present invention.

With reference now to FIG. 3, a driver circuit embodiment in accordance with this invention is shown. The circuit of FIG. 3 differs from the conventional circuit of FIG. 2 in that it includes zener diode 34, n-channel transistor 30, and n-channel transistor 32, coupled between the gate and source of transistor 10. The drain of transistor 30 is connected to the gate of power transistor 10. The source of transistor 32 is connected to the source of transistor 30. The gate of transistors 30 and 32 are connected to switch 22. The drain of transistor 32 is connected to diode 16, inductive load 12, and the source of power transistor 10. In this embodiment, transistors 30 and 32 provide a turn-off current path between the gate to source of power transistor 10. Diode 34 protects transistors 30 and 32 by limiting the $V_{gs}$ (gate to source voltage) of transistor 30 and 32 to the breakdown voltage of the zener diode 34. Transistor 30 has an intrinsic diode 35 and transistor 32 has an intrinsic diode 36.

In operation, power transistor 10 is on when switch 21 provides a sufficient positive voltage Vp to its gate, with switch 22 grounding the gates of transistors 30 and 32 so that they are off. In this state, no feedback path exists between the source and gate of the power transistor 10 since the transistors 30 and 32 are off and since their source-to-drain intrinsic diodes 35 and 36, respectively, are anode to anode, thereby blocking the potential current path. Signals 18 and 24 illustrate that switches 21 and 22 operate synchronously.

Since power transistor 10 is on, its source is at a positive voltage potential. In this condition, zener diode 34 would be forward biased if transistor 32 was not blocking its current path. Therefore, transistor 32 is necessary to allow the circuit to use zener diode 34 to clamp the gate-to-source voltage. Without transistor 32, a zener diode would provide a conductive path from the inductive load to ground when power transistor 10 is on.

Power transistor 10 is turned off by opening switch 21 to float the gate to power transistor 10 (or to ground as discussed above) while switching switch 22 to provide a sufficiently high voltage Vp to turn on transistors 30 and 32. The current path provided by transistors 30 and 32 quickly turn off power transistor 10 by depleting the charge from the gate of power transistor 10. As the power transistor 10 is turned off, the inductive load may pull the source of the power transistor to a voltage level below ground. In this event, the $V_{gs}$ (gate to source voltage) of transistors 30 and 32 will increase until the zener diode 34 clamps this $V_{gs}$ to the threshold voltage of zener diode 34. Consequently, zener diode 34 protects transistors 30 and 32 from excessive gate-source voltage. Although this embodiment is described and illustrated using the zener diode 34, it is understood that the diode functions as a voltage regulator and that other voltage regulator diodes can be used without departing from the spirit of the invention.

Figure 4:
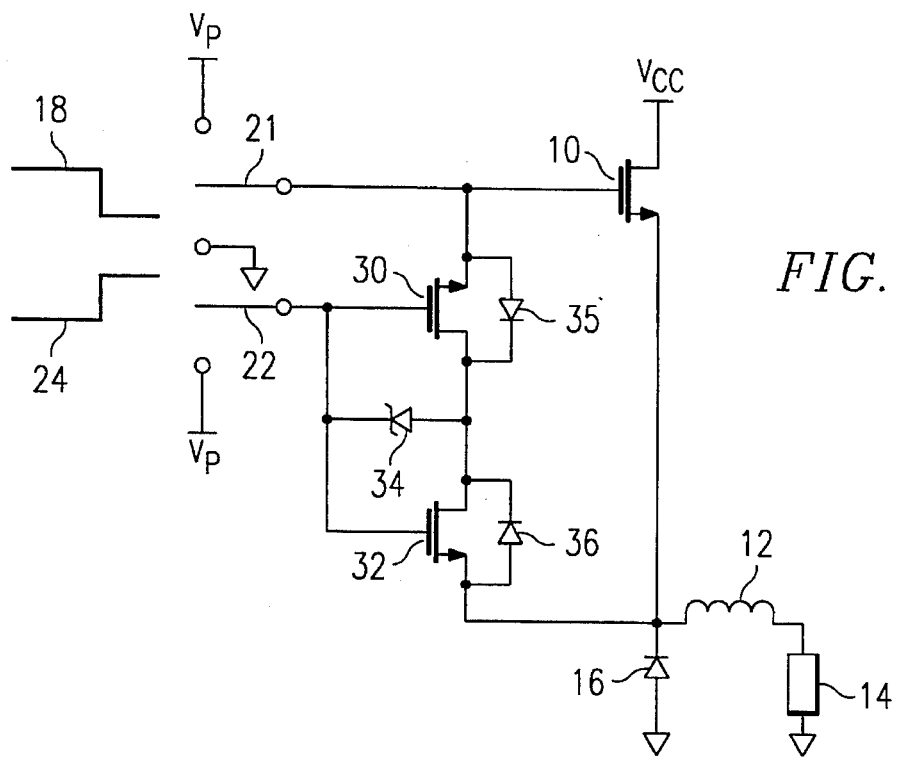
FIG. 4 is an electrical schematic diagram of a circuit in accordance with a second preferred embodiment of the present invention.

In another embodiment as shown in FIG. 4, the drains of transistors 30 and 32 are connected in common, rather than their sources. Specifically, the source of transistor 30 is connected to the gate of power transistor 10 and, the drain of transistor 32 is connected to the drain of transistor 30. The gate of transistors 30 and 32 are connected to switch 22. The source of transistor 32 is connected to diode 16, inductive load 12, and the source of power transistor 10. In this embodiment, transistor 30 and 32 provide a turn-off current path between the gate to source of power transistor 10. Zener diode 34 protects transistors 30 and 32 by limiting the $V_{gs}$ (gate to source voltage) to its breakdown voltage.

In operation, power transistor 10 is on when switch 21 provides a sufficient positive voltage Vp and switch 22 grounds the gates of transistors 30 and 32 so that they are off. In this state, no feedback path exists between the source and gate of the power transistor 10 since the transistors 30 and 32 are off such that their source-to-drain intrinsic diodes 35 and 36, respectively, are cathode to cathode, thereby blocking the potential current path. Signals 18 and 24 illustrate that switches 21 and 22 operate synchronously.

Since power transistor 10 is on, its source is at a positive voltage potential. In this condition, zener diode 34 would be forward biased if transistor 32 was not blocking its current path. Therefore, transistor 32 is necessary to allow the circuit to use zener diode 34 to clamp the gate-to-source voltage. Without transistor 32, a zener diode would provide a conductive path from the inductive load to ground when power transistor 10 is on.

Power transistor 10 is turned off by opening switch 21 to float the gate to power transistor 10 while switching switch 22 to provide a sufficiently high voltage Vp to turn on transistors 30 and 32. The current path provided by transistors 30 and 32 quickly turn off power transistor 10 by depleting the charge from the gate of power transistor 10. As the power transistor 10 is turned off, the inductive load pulls the source of the power transistor to a voltage level below ground. Simultaneously, the $V_{gs}$ (gate to source voltage) of transistors 30 and 32 increases until the zener diode clamps $V_{gs}$ to the threshold voltage of the diode. Consequently, zener diode 34 protects transistors 30 and 32 from excessive gate-to-source voltage. Although this embodiment is described and illustrated using the zener diode 34, it is understood that the diode functions as a voltage regulator and that other voltage regulator diodes can be used without departing from the spirit of the invention.

Figure 5:
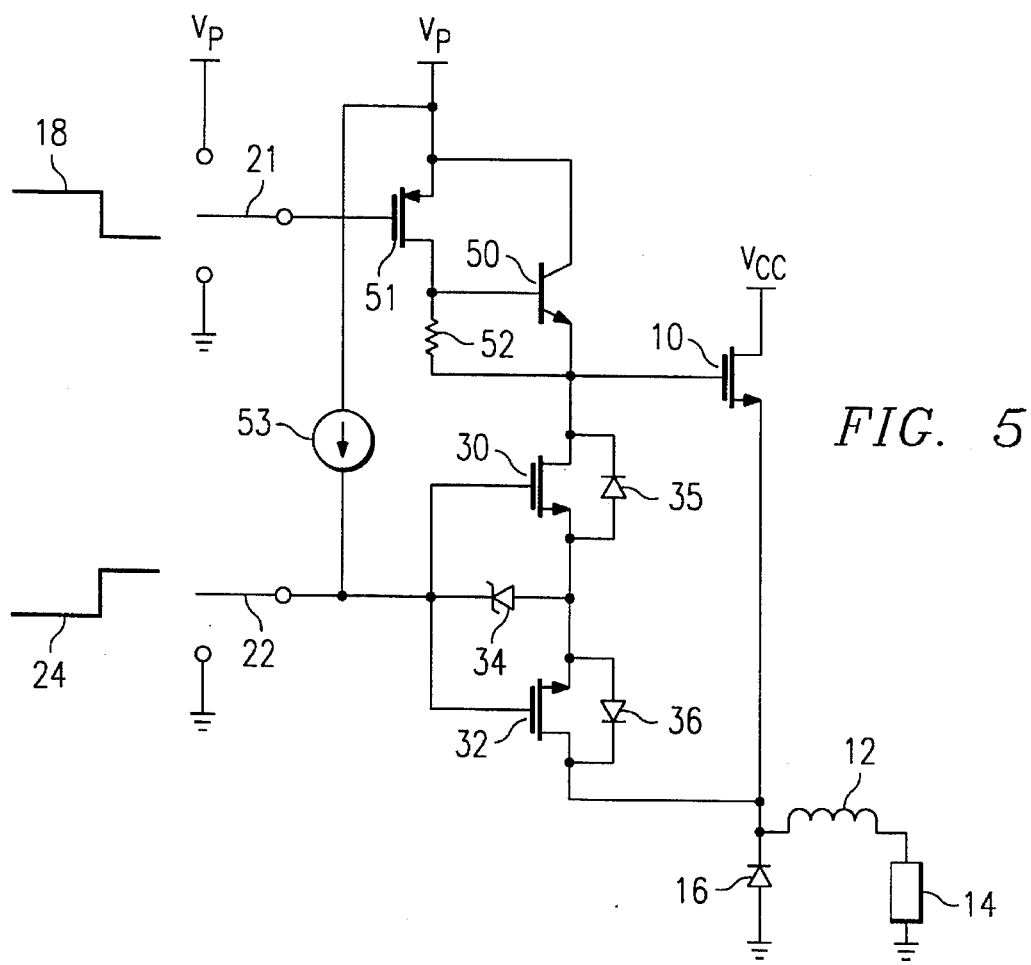
FIG. 5 is an electrical schematic diagram of a circuit in accordance with a third preferred embodiment of the present invention.

In another embodiment as shown in FIG. 5, the circuit includes transistor 50, and 51 for driving power transistor 10 and current source 53 for driving transistor 30 and 32. Specifically, the drain of transistor 30 is connected to the gate of power transistor 10. The source of transistor 32 is connected to the source of transistor 30. The gate of transistors 30 and 32 are connected to switch 22 and current source 53. The drain of transistor 32 is connected to diode 16, inductive load 12, and the source of power transistor 10. In this embodiment, transistor 30 and 32 provide a turn-off current path between the gate to source of power transistor 10. Zener diode 34 protects transistors 30 and 32 by limiting the $V_{gs}$ (gate-to-source voltage) to the breakdown voltage of the zener diode 34.

In operation, power transistor 10 is on when switch 21 is grounded which turns on transistors 51 and 50 to drive power transistor 10 on. Simultaneously, switch 22 grounds the gates of transistors 30 and 32 so that they are off. In this state, no feedback path exists between the source and gate of the power transistor 10 since the transistors 30 and 32 are off and their intrinsic diodes 35 and 36, respectively, are anode to anode, thereby blocking the potential current path.

Since power transistor 10 is on, its source is at a positive voltage potential. In this condition, zener diode 34 would be forward biased if transistor 32 was not blocking its current path. Therefore, transistor 32 is necessary to allow the circuit to use zener diode 34 to clamp the gate-to-source voltage. Without transistor 32, a zener diode would provide a conductive path from the inductive load to ground when power transistor 10 is on.

Power transistor 10 is turned off by switching switch 21 to Vp to turn off transistor 51 and 50, while opening switch 22 so that current source 53 provides a sufficiently high voltage Vp to turn on transistors 30 and 32. Signals 18 and 24 illustrate that switches 21 and 22 operate synchronously. The current path provided by transistors 30 and 32 quickly turn off power transistor 10 by depleting the charge from the gate of power transistor 10. As the power transistor 10 is turned off, the recirculation of the inductive load pulls the source of the power transistor to a voltage level below ground. Simultaneously, the $V_{gs}$ (gate to source voltage) of transistors 30 and 32 increases until the zener diode clamps $V_{gs}$ to the threshold voltage of the diode. Consequently, the zener diode 34 protects transistors 30 and 32 from excessive gate-to-source voltage. Although this embodiment is described and illustrated using the zener diode 34, it is understood that the diode functions as a voltage regulator and that other voltage regulator diodes can be used without departing from the spirit of the invention.

Although the invention has been described and illustrated with a certain degree of particularity, it is understood that the present disclosure has been made only by way of example, and that numerous changes in the combination and arrangement of parts, such as substituting p-channel for n-channel FETs, can be resorted to by those skilled in the art without departing from the spirit and scope of the invention, as herein claimed.

I claim:

1. A circuit for reducing a turn-off time of a power transistor, comprising:

a first transistor, having a gate and having a source-drain path connected on a first end to a gate of said power transistor, the source-drain path having a second end;

a second transistor having a source-drain path connected at a first end to the second end of said first transistor, having a second end connected to a source of said power transistor, having a gate connected to the gate of said first transistor, and a first and a second means for controlling said power transistor such that when said power transistor is turned on, said first and second transistors are turned off and when said power transistor is turned off, said first and second transistors are turned on.

2. The circuit of claim 1 further comprising a voltage regulator diode for preventing an over-voltage condition, the voltage regulator connected between the second end of said first transistor and the gates of said first and second transistors.

3. The circuit of claim 2 wherein said diode comprise a zener diode.

4. The circuit of claim 1 wherein said first transistor and said second transistor are field effect transistors.

5. The circuit of claim 4 wherein said first transistor and said second transistor are n-channel field effect transistors.

6. A circuit for driving an inductive load, comprising:

a power transistor having a drain connected to a Vcc voltage, having a source connected to said inductive load, and having a gate;

a first transistor having a drain connected to the gate of said power transistor, having a source, and having a gate;

a second transistor having a source connected to the source of said first transistor, having a drain connected to the source of said power transistor, and having a gate connected to the gate of said first transistor; and a first and second means for controlling said power transistor such that when said power transistor is turned on, said first and second transistor are turned off and when said power transistor is turned on, said first and second transistor are turned off.

7. The circuit of claim 6 further comprising a voltage regulator diode having an anode connected to the source of said first transistor and the source of said second transistors, and having a cathode connected to the gate of said first transistor and to the gate of said second transistor.

8. The circuit of claim 7 wherein said diode comprises a zener diode.

9. The circuit of claim 6 wherein said first transistor and said second transistor comprise field effect transistors.

10. The circuit of claim 9 wherein said first transistor and said second transistor are n-channel MOSFETS.

11. A circuit for reducing a turn-off time of a power transistor, comprising:

a first transistor, having a source connected to a gate of said power transistor, having a drain, and having a gate;

a second transistor having a drain connected to the drain of said first transistor, having a source connected to a source of said power transistor, having a gate connected to the gate of said first transistor; and a first and second means for controlling said power transistor such that when said power transistor is turned on, said first and second transistors are turned off and when said power transistor is turned off, said first and second transistors are turned on.

12. The circuit of claim 11 further comprising a voltage regulator diode connected between the gates and drains of said first and second transistors.

13. The circuit of claim 12 wherein said diode comprises a zener diode.

14. The circuit of claim 11 wherein said first transistor and said second transistor are field effect transistors.

15. The circuit of claim 14 wherein said first transistor and said second transistor are n-channel field effect transistors.

16. A method for reducing a turn-off time of a power transistor comprising the step of:

clamping a gate to a source of said power transistor by using a first n-channel MOSFET transistor connected in series with a second n-channel MOSFET transistor as a current path for said clamping wherein each of the two transistors have a parasitic source to drain diode and wherein the first and second transistors are configured drain to drain so that the parasitic diode of the first transistor blocks the current through the parasitic diode of the second transistor.

17. The method of claim 16 wherein the step of clamping further comprises limiting a gate to drain voltage of said first and second n-channel MOSFET transistors with a zener diode.

* * * * *